United States Patent
Okuno

(10) Patent No.: US 6,701,500 B2
(45) Date of Patent: Mar. 2, 2004

(54) LOGIC CIRCUIT MODULE, METHOD FOR DESIGNING A SEMICONDUCTOR INTEGRATED CIRCUIT USING THE SAME, AND SEMICONDUCTOR INTEGRATED CIRCUIT

(75) Inventor: Noritaka Okuno, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/855,606

(22) Filed: May 16, 2001

(65) Prior Publication Data

US 2001/0044924 A1 Nov. 22, 2001

(30) Foreign Application Priority Data

May 16, 2000 (JP) ........................................ 2000-143603

(51) Int. Cl.[7] .............................................. G06F 17/50
(52) U.S. Cl. ................. 716/8; 716/1; 716/16; 326/37; 326/38; 326/41; 326/47
(58) Field of Search .................... 716/1–18; 326/37–41, 326/47, 113, 104, 121

(56) References Cited

U.S. PATENT DOCUMENTS

| | | |
|---|---|---|
| 5,055,718 A | 10/1991 | Galbraith et al. |
| 5,198,705 A | 3/1993 | Galbraith et al. |
| 5,338,983 A | 8/1994 | Agarwala |
| 5,440,245 A | 8/1995 | Galbraith et al. |
| 5,491,431 A | 2/1996 | Nasserbakht |
| 5,502,402 A | 3/1996 | Mehendale |
| 5,508,637 A | 4/1996 | Mehendale |
| 5,610,534 A | 3/1997 | Galbraith et al. |
| 5,751,162 A | 5/1998 | Mehendale et al. |
| 6,124,736 A * | 9/2000 | Yamashita et al. .......... 326/113 |
| 6,185,719 B1 * | 2/2001 | Sako .............................. 716/1 |
| 6,208,163 B1 * | 3/2001 | Wittig et al. .................. 326/39 |
| 6,323,690 B1 * | 11/2001 | Yamashita et al. .......... 326/113 |
| 6,400,183 B2 * | 6/2002 | Yamashita et al. .......... 326/113 |

FOREIGN PATENT DOCUMENTS

| | | |
|---|---|---|
| JP | 6-112444 | 4/1994 |
| JP | 09-026870 | 1/1997 |
| JP | 09-284124 | 10/1997 |

* cited by examiner

Primary Examiner—Vuthe Siek
(74) Attorney, Agent, or Firm—McDermott, Will & Emery

(57) ABSTRACT

A logic circuit module is used for designing a semiconductor integrated circuit using an FPGA (Field Programmable Gate Array) or a short-term gate array. Provided that a seventh input terminal of the logic circuit module is fixed to the power supply, a third multiplexer always selects the output of a second multiplexer, and a signal selected by the second multiplexer is directly output to a second output terminal. Moreover, an AND circuit always outputs an output signal of a first multiplexer to a first output terminal. Thus, fixing the seventh input terminal to the power supply causes respective logics formed from the first multiplexer and the second multiplexer to be separated by the third multiplexer, allowing for independent representation of the logics. Accordingly, the area efficiency of the logic circuit module is improved, resulting in reduction in size of the semiconductor integrated circuit.

29 Claims, 16 Drawing Sheets

```
if (Logic1)begin
    Res1=Exp1T;
    Res2=Exp2T;
         :
end
else begin
    Res1=Exp1F;
    Res2=Exp2F;
         :
end
```

LOGIC CIRCUIT MODULE, METHOD FOR DESIGNING A SEMICONDUCTOR INTEGRATED CIRCUIT USING THE SAME, AND SEMICONDUCTOR INTEGRATED CIRCUIT

BACKGROUND OF THE INVENTION

The present invention relates to a logic circuit module having excellent area efficiency and capable of representing a large number of logics, a method for designing a semiconductor integrated circuit using such a logic circuit module, and a semiconductor integrated circuit.

In an FPGA (Field Programmable Gate Array), a device is first manufactured in such a form that can be used for general purposes, so that a desired circuit operation is implemented by writing data to storage elements incorporated in advance into the device or blowing fuses.

In general, a gate array is produced in advance up to a transistor portion, so that a desired circuit operation is implemented using all wiring layers. However, there is also a short-term gate array in order to implement a desired circuit in a shorter period. In the short-term gate array, not all of the wiring layers are produced in advance. Instead, some of the wiring layers are produced in advance, so that a desired circuit is formed using only the remaining wiring layers.

Moreover, in a cell base IC (Integrated Circuit), correction macro cells are incorporated in advance in order to quickly handle any erroneous circuit design found in the manufactured cell base IC. Thus, when the necessity for correction arises, only the wiring layers are corrected using the correction macro cells.

Such an FPGA and short-term gate array have a small amount of individually modifiable wiring resources for forming a semiconductor integrated circuit implementing a desired operation. Therefore, not a small unit like a transistor but a logic module capable of implementing a large number of logics by a single unit is used as a base unit for implementing a logic, in order to reduce the amount of individually modifiable wirings. A method for designing a semiconductor integrated circuit in such a conventional FPGA and short-term gate array will now be described in connection with FIGS. 16A and 16B. Conventionally, as shown in FIG. 16A, a multiplicity of 4-1 multiplexers M13 are used as logic circuit modules in order to form a logic circuit in such a form that can be used for general purposes. Each input terminal of the logic circuit module M13 is connected to a power supply, ground or external wiring, thereby expressing a plurality of types of logic circuits. FIG. 16B shows an example of a NAND logic implemented with the logic circuit module M13. In FIG. 16B, input terminals TI1311, TI1312 and TI1313 are connected to a power supply, an input terminal TI1314 is grounded, and input terminals TI1315 and TI1316 are respectively connected to external input terminals A13 and A14. An output terminal TO1311 is connected to an external output terminal Y13. Thus, a NAND output of the external input terminals A13 and A14 is output to the external output terminal Y13.

A conventional implementation method in which macro cells are incorporated in advance for correction on the cell base IC will now be described in connection with FIGS. 13A to 13C. FIG. 13A shows an uncorrected, original circuit. In this circuit, an OR logic circuit C314 obtains an OR logic of respective outputs of logic circuits C311, C312 and C313, and applies the OR logic output to an input of a logic circuit C315. It is now assumed that this circuit should be corrected so as to apply an AND logic of the logic circuits C311, C312 and C313 to the input of the logic circuit C315 instead of the OR logic. FIG. 13C shows an example of the circuit corrected using NAND macro cells incorporated in advance. The dashed lines in the figure indicate a corrected portion. In this example, four NAND macro cells are used for correction.

In the conventional FPGA and short-term gate array, the logic circuit module M13 of FIGS. 16A and 16B is capable of representing all of two-input logic circuits, but has a larger area than that of an individually implemented two-input logic circuit. In particular, a single logic circuit module is required even if only a basic gate is necessary. This results in extremely disadvantageous area efficiency in the case of a semiconductor integrated circuit that merely requires a large number of basic gates. Thus, the resultant semiconductor integrated circuit has a large size. A semiconductor integrated circuit for digital signal processing uses a large number of adders as its circuit portion. In designing such a semiconductor integrated circuit, the adders cannot be efficiently implemented in terms of the area. Moreover, in the case of a semiconductor integrated circuit using a large number of at least three-input logic circuits, a desired semiconductor integrated circuit can be reduced in size with improved area efficiency if the at least three-input logic circuits can be implemented with a logic circuit module. In fact, however, the logic circuit module M13 can implement only a small number of types of at least three-input logic circuits. Therefore, the resultant semiconductor integrated circuit has an extremely large size.

Moreover, in the correction of a cell base IC, a portion to be corrected of a designed semiconductor circuit cannot be predicted, and NAND macro cells to be incorporated in advance must be distributed all over the semiconductor circuit. Accordingly, a long wiring length is likely to be required for partial correction, and the number of wiring layers to be modified for correction is likely to be increased. Macro cells to be incorporated in advance normally use basic gates, and therefore a large number of wiring layers are required for correction. As a result, even a slight increase in circuit scale to be corrected makes the correction difficult.

SUMMARY OF THE INVENTION

It is an object of the present invention to improve the structure of a logic circuit module so as to increase the area efficiency of the logic circuit module when implementing various logic gates in an FPGA and a short-term gate array, and thus reduce the size of the resultant semiconductor integrated circuit. It is another object of the present invention to reduce the wiring length for correction by using improved logic circuit modules as macro cells to be incorporated in advance in preparation for correction of a cell base IC. It is still another object of the present invention to reduce the number of wiring layers to be modified for correction so as to enable correction to be made in an excellent manner even if the circuit scale to be corrected is somewhat increased.

In order to achieve these objects, the present invention enables a plurality of logic functions to be represented with a single logic circuit module, and also enables a half adder to be formed with a single logic circuit module.

More specifically, a logic circuit module according to the present invention is characterized in that it comprises a plurality of input terminals, a plurality of output terminals, and a plurality of logic elements provided between the plurality of input terminals and the plurality of output terminals, the plurality of input terminals are each connected to an external signal line, a power supply or a ground so as to implement a plurality of desired logic functions, and at least two of the implemented plurality of logic functions are such that a potential state of an output terminal corresponding to one of the logic functions is not affected by a potential state of an input terminal corresponding to the other logic function.

The logic circuit module according to the present invention is characterized in that at least one of the plurality of logic elements separates at least two of the implemented plurality of logic functions from each other so as to make the two logic functions independent of each other.

A logic circuit module according to the present invention is characterized in that it comprises first to seventh input terminals, first and second output terminals, and first to third 2-1 multiplexers, the first 2-1 multiplexer has its two signal terminals respectively connected to the first and second input terminals, and its selection terminal connected to the third input terminal, the second 2-1 multiplexer has its two signal terminals respectively connected to the fourth and fifth input terminals, and its selection terminal connected to the sixth input terminal, the third 2-1 multiplexer has its two signal terminals respectively connected to signals selected by the first and second 2-1 multiplexers, and its selection terminal connected to the seventh input terminal, the first output terminal receives the signal selected by the first 2-1 multiplexer, and the second output terminal receives a signal selected by the third 2-1 multiplexer.

The logic circuit module according to the present invention is characterized in that it further comprises a two-input AND circuit, the AND circuit receives the signal selected by the first 2-1 multiplexer, the seventh input terminal is connected to the AND circuit, and the first output terminal receives an output signal of the AND circuit.

The logic circuit module according to the present invention is characterized in that the third input terminal serves also as the sixth input terminal.

The logic circuit module according to the present invention is characterized in that the first, third, fourth and sixth input terminals are respectively connected to external signal lines, and the second, fifth and seventh input terminals are connected to a power supply, thereby implementing two independent OR logics.

The logic circuit module according to the present invention is characterized in that the first and fourth input terminals are connected to a ground, the seventh input terminal is connected to a power supply, and the second, third, fifth and sixth input terminals are respectively connected to external signal lines, thereby implementing two independent AND logics.

The logic circuit module according to the present invention is characterized in that the first to sixth input terminals are respectively connected to external signal lines, and the seventh input terminal is connected to a power supply, thereby implementing two independent 2-1 multiplexer logics.

The logic circuit module according to the present invention is characterized in that the first and fifth input terminals are connected to a ground, the second and fourth input terminals are connected to a power supply, the third and sixth input terminals are connected to a common external signal line, and the seventh input terminal is connected to another external signal line so as to form an EX-OR logic and an AND logic each receiving as inputs two signals of the common external signal line and the another external signal line, thereby implementing a half adder.

A semiconductor integrated circuit according to the present invention is characterized in that it comprises four logic circuit modules each implementing the half adder, and a single logic circuit module implementing the two OR logics, and a lower-bit full adder is formed from two of the four logic circuit modules each implementing the half adder and one of the two OR logics implemented by the logic circuit module, and an upper-bit full adder is formed from the other two logic circuit modules each implementing the half adder and the other OR logic implemented by the logic circuit module, thereby implementing a 2-bit full adder.

The logic circuit module according to the present invention is characterized in that the second, fifth and sixth input terminals are respectively connected to external signal lines, the first input terminal is connected to a ground, the seventh input terminal is connected to a power supply, the third input terminal is connected to the second output terminal, and the fourth input terminal is connected to the first output terminal so as to form an AND logic and a 2-1 multiplexer that are independent of each other, and an output of the AND logic is connected to one of two signal terminals of the 2-1 multiplexer, thereby implementing a storage circuit having a reset function.

The logic circuit module according to the present invention is characterized in that the second and seventh input terminals are connected to a power supply, the first, fifth and sixth input terminals are respectively connected to external signal lines, the third input terminal is connected to the second output terminal, and the fourth input terminal is connected to the first output terminal so as to form an OR logic and a 2-1 multiplexer that are independent of each other, and an output of the OR logic is connected to a signal terminal of the 2-1 multiplexer, thereby implementing a storage circuit having a set function.

Moreover, a method for designing a semiconductor integrated circuit according to the present invention is characterized in that the semiconductor integrated circuit includes a plurality of logic circuit modules, and the semiconductor integrated circuit conducting a prescribed operation is designed by connecting the input terminals of the logic circuit modules to a power supply or ground, or connecting an input terminal of a logic circuit module to an output terminal of another logic circuit module.

The method according to the present invention is characterized by designing the semiconductor integrated circuit conducting the prescribed operation by forming in advance longitudinal and lateral wirings for connecting the input terminals of the logic circuit modules to the power supply or ground, or connecting the input terminals of the logic circuit modules to the output terminals thereof, and a plurality of connecting means for connecting the longitudinal and lateral wirings to each other, and then programming so as to connect prescribed longitudinal and lateral wirings to each other through a prescribed one of the plurality of connecting means.

A method for designing a semiconductor integrated circuit according to the present invention is characterized by manufacturing the semiconductor integrated circuit with the logic circuit module incorporated therein, and when necessity for correction of the manufactured semiconductor integrated circuit arises, correcting the semiconductor integrated circuit by connecting a wiring to the incorporated logic circuit module.

Thus, the present invention is capable of implementing at least two independent logic circuits per logic circuit module.

Therefore, the area efficiency of the logic circuit module is improved over the conventional example in which only a single logic circuit is implemented per logic circuit module. Moreover, the required number of logic circuit modules is reduced, allowing for reduction in area of a wiring region provided for wirings that connect the logic circuit modules to each other. As a result, a designed semiconductor integrated circuit is reduced in size. Moreover, each logic circuit module of the present invention has a plurality of output terminals. Therefore, the logic circuit module of the present invention can represent an increased number of types of logic circuits as compared to the conventional logic circuit module having only one output terminal. For example, the logic circuit module of the present invention can represent a half adder, which cannot be represented with a single logic circuit module in the conventional example.

Moreover, according to the present invention, the logic circuit module of the present invention is incorporated in advance into the semiconductor integrated circuit for the purpose of correcting a cell base IC. Therefore, even when the necessity for correction of the manufactured semiconductor integrated circuit arises, two or more logic circuits can be integrated into a single logic circuit module, whereby the wiring length for connecting the required logic circuits to each other as well as the number of wiring layers to be modified for correction are reduced.

DETAILED DESCRIPTION OF THE INVENTION

Hereinafter, embodiments of a logic circuit module, a method for designing a semiconductor integrated circuit using the same, and a semiconductor integrated circuit according to the present invention will be described in detail with reference to the accompanying drawings.

(Logic circuit module)

Figure 1:
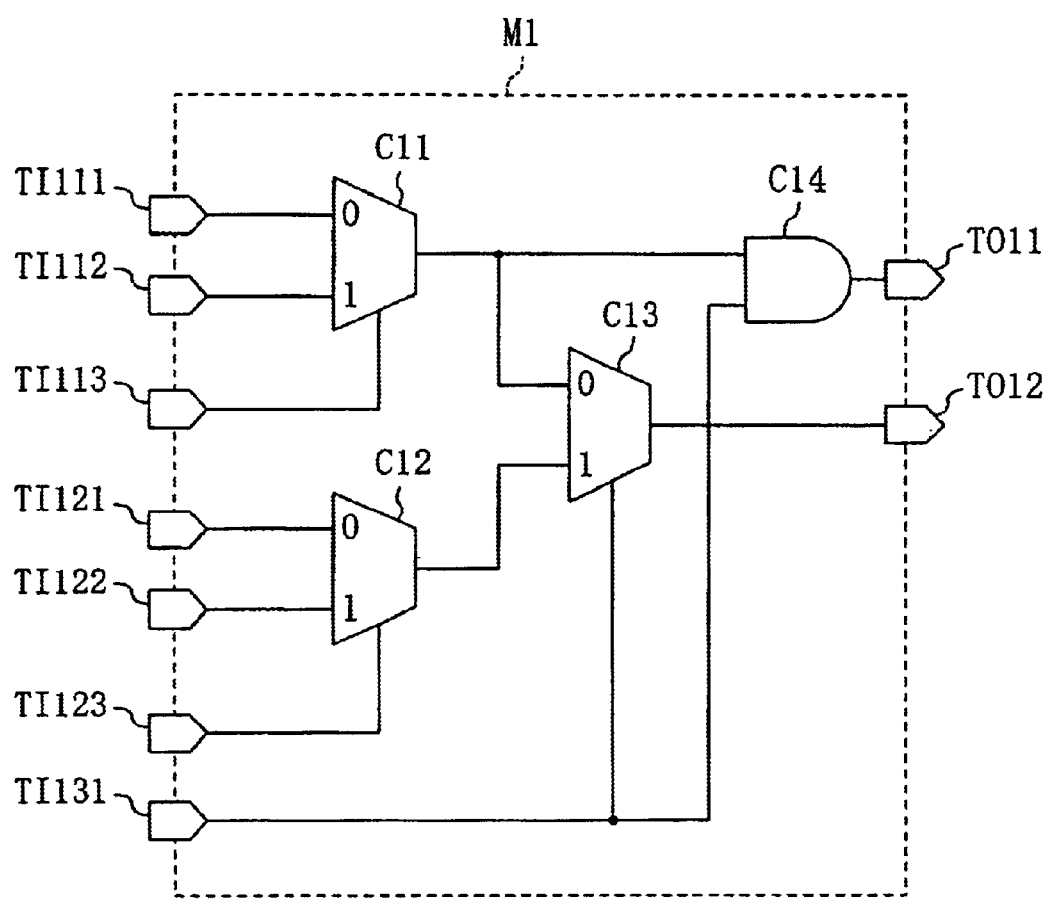
FIG. 1 is a diagram showing an example of a logic circuit module according to an embodiment of the present invention.

An exemplary logic circuit module according to an embodiment of the present invention is shown in FIG. 1. In FIG. 1, a logic circuit module M1 has first to seventh input terminals TI111, TI112, TI113, TI121, TI122, TI123, TI131, first and second output terminals TO11, TO12, first to third 2-1 multiplexers (logic elements) C11, C12, C13, and a single 2-input AND circuit (logic element) C14.

The first and second input terminals TI111 and TI112 are respectively connected to two signal terminals of the first multiplexer C11, and the third input terminal TI113 is connected to a selection terminal of the first multiplexer C11. The first multiplexer C11 selects a signal of the second input terminal TI112 when a potential at the third input terminal TI113 is at H (High) level, and selects a signal of the first input terminal TI111 when the potential at the third input terminal TI113 is at L (Low) level. Similarly, the fourth and fifth input terminals TI121 and TI122 are respectively connected to two signal terminals of the second multiplexer C12, and the sixth input terminal TI123 is connected to a selection terminal of the second multiplexer C12. The second multiplexer C12 selects a signal of the fifth input terminal TI122 when a potential at the sixth input terminal TI123 is at H level, and selects a signal at the fourth input terminal TI121 when a potential at the sixth input terminal TI123 is at L level.

The signals selected by the first and second multiplexers C11 and C12 are respectively connected to two signal terminals of the third multiplexer C13, and the seventh input terminal TI131 is connected to a selection terminal of the third multiplexer C13. The third multiplexer C13 selects an output signal of the second multiplexer C12 when a potential at the seventh input terminal TI131 is at H level, and selects an output signal of the first multiplexer C11 when a potential at the seventh input terminal TI131 is at L level. The signal selected by the third multiplexer C13 is output to the second output terminal TO12.

The signal selected by the first multiplexer C11 is output to one input terminal of the two-input AND circuit C14, and the seventh input terminal TI131 is connected to the other input terminal thereof. An output of the AND circuit C14 is directly output to the first output terminal TO11.

Provided that the seventh input terminal TI131 of the logic circuit module Ml is fixed to the power supply, the third multiplexer C13 always selects the output of the second multiplexer C12, and the signal selected by the second multiplexer C12 is directly output to the second output terminal TO12. Moreover, the AND circuit C14 always outputs the output signal of the first multiplexer C11 to the first output terminal TO11. Thus, fixing the seventh input terminal TI131 to the power supply causes the respective logics formed from the first multiplexer C11 and the second multiplexer C12 to be separated by the third multiplexer C13, allowing for independent representation of the logics.

Hereinafter, an example of the logic circuit module MI implemented in a CMOS circuit device will be described in connection with FIGS. 2A and 2B.

Figure 2A:
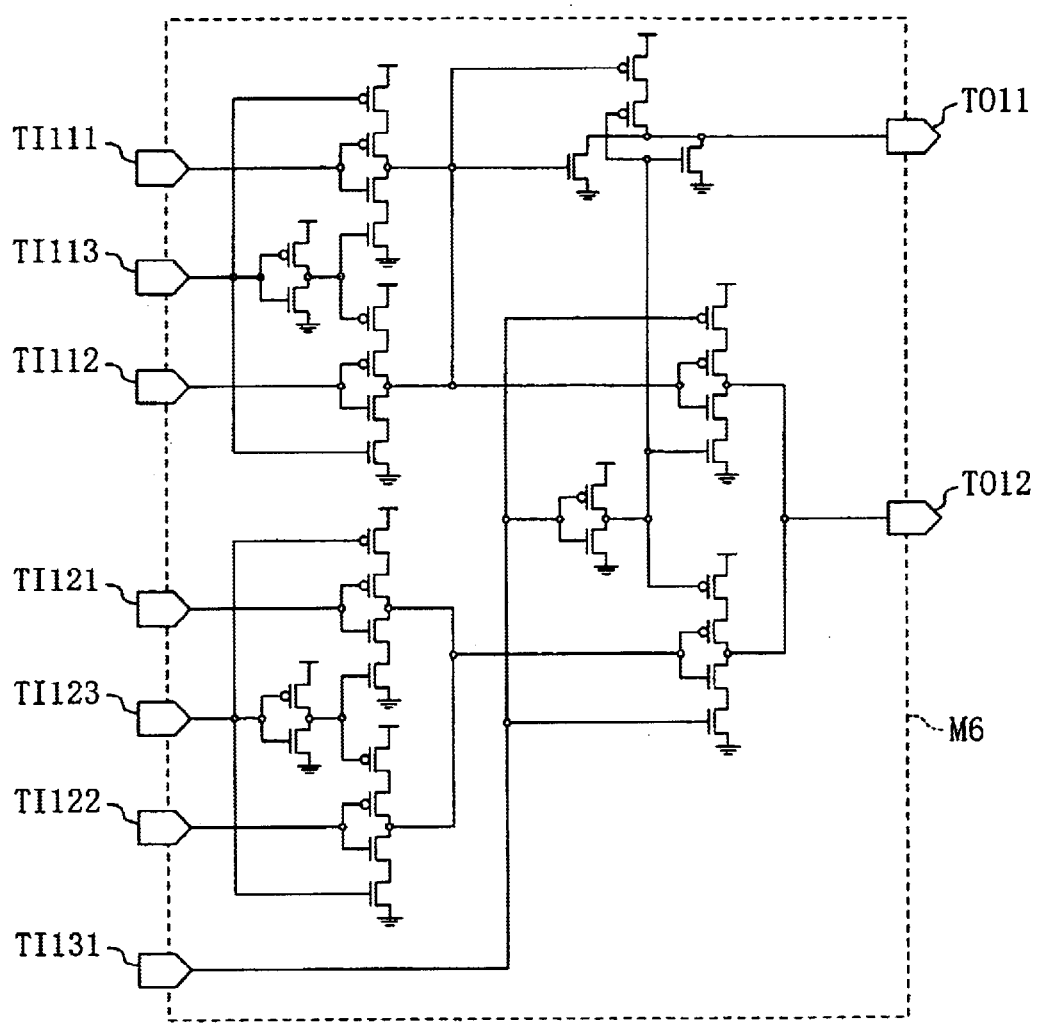
FIG. 2A is a diagram showing an exemplary structure of a CMOS (Complementary Metal-Oxide Semiconductor) circuit for implementing the logic circuit module.
Figure 2B:
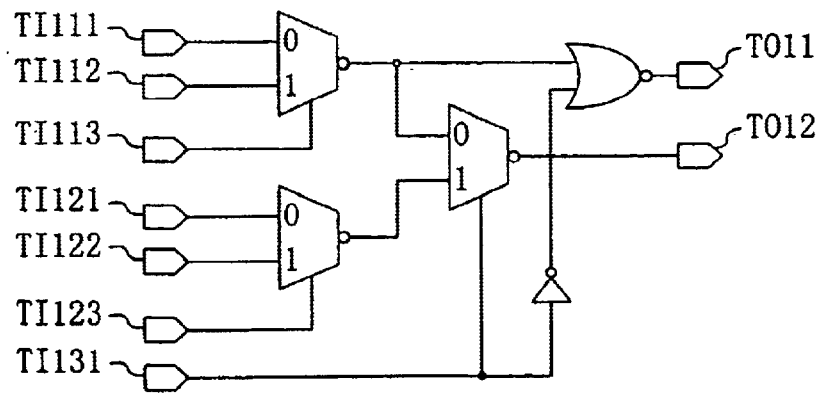
FIG. 2B is a diagram showing an equivalent circuit of the CMOS circuit.

In FIGS. 2A and 2B, the same reference numerals and characters as those of FIG. 1 denote the same components. Connecting P-channel and N-channel CMOS transistors to each other as shown in FIG. 2A results in an equivalent circuit of FIG. 2B. A logic circuit module M6 is logically equivalent to the logic circuit module M1 of FIG. 1.

(Two independent OR circuits)

Figure 3A:
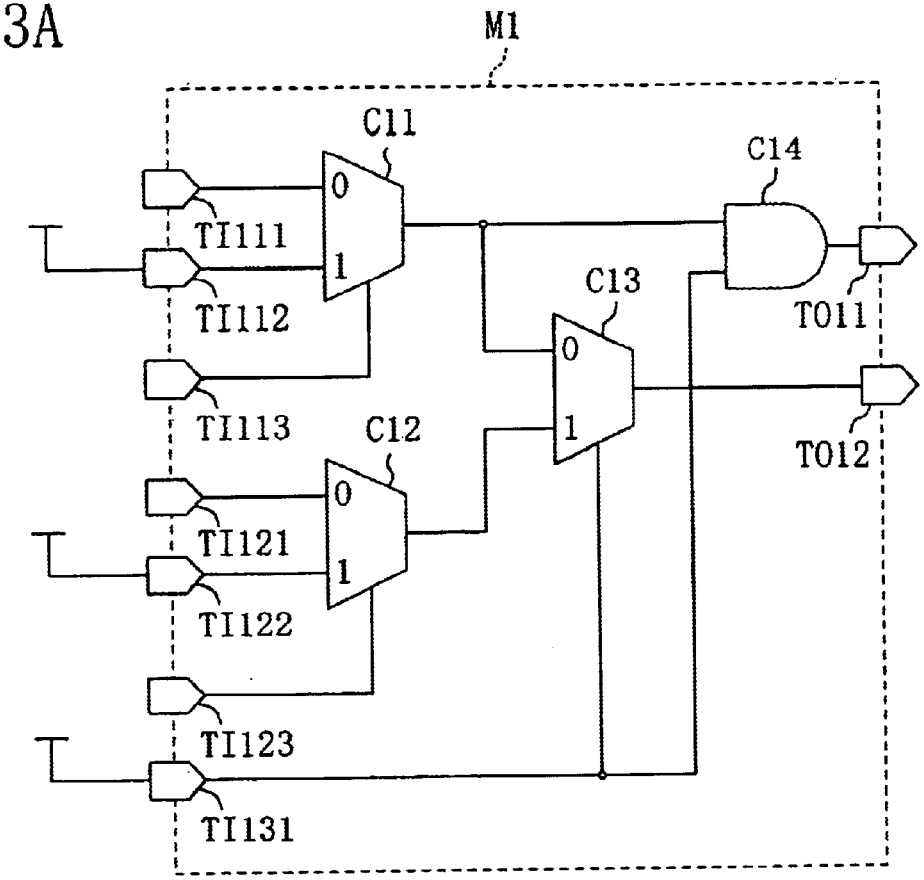
FIGS. 3A and 3B are diagrams showing the connection for implementing two independent OR logics using the logic circuit module.
Figure 3B:
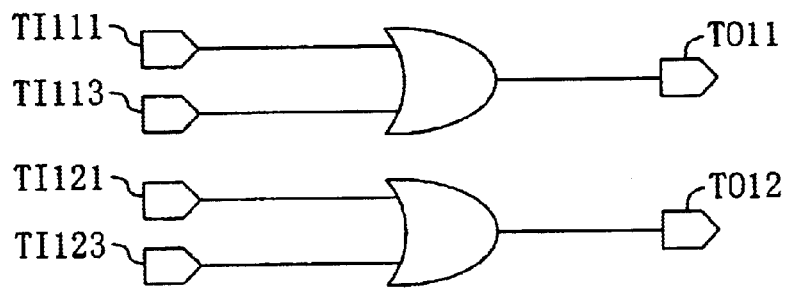

In FIGS. 3A and 3B, the same reference numerals and characters as those of FIG. 1 denote the same components. As shown in FIG. 3A, the second, fifth and seventh input terminals TI112, TI122 and TI131 of the logic circuit module M1 are connected to the power supply. As shown in FIG. 3B, such a structure enables the following two OR logics to be implemented independently of each other: an OR logic having the first and third input terminals TI111 and TI113 as its inputs and the first output terminal TO11 as its output; and an OR logic having the fourth and sixth input terminals TI121 and TI123 as its inputs and the second output terminal TO12 as its output. In other words, a potential state of the output terminal TO11 of one OR logic is not affected by respective potential states of the input terminals TI121 and TI123 of the other OR logic, and a potential state of the output terminal TO12 of the other OR logic is not affected by respective potential states of the input terminals TI111 and TI113 of one OR logic. Other implementation examples of such two independent logics are shown in FIGS. 4A, 4B and 5A, 5B.

(Two independent AND circuits)

Figure 4A:
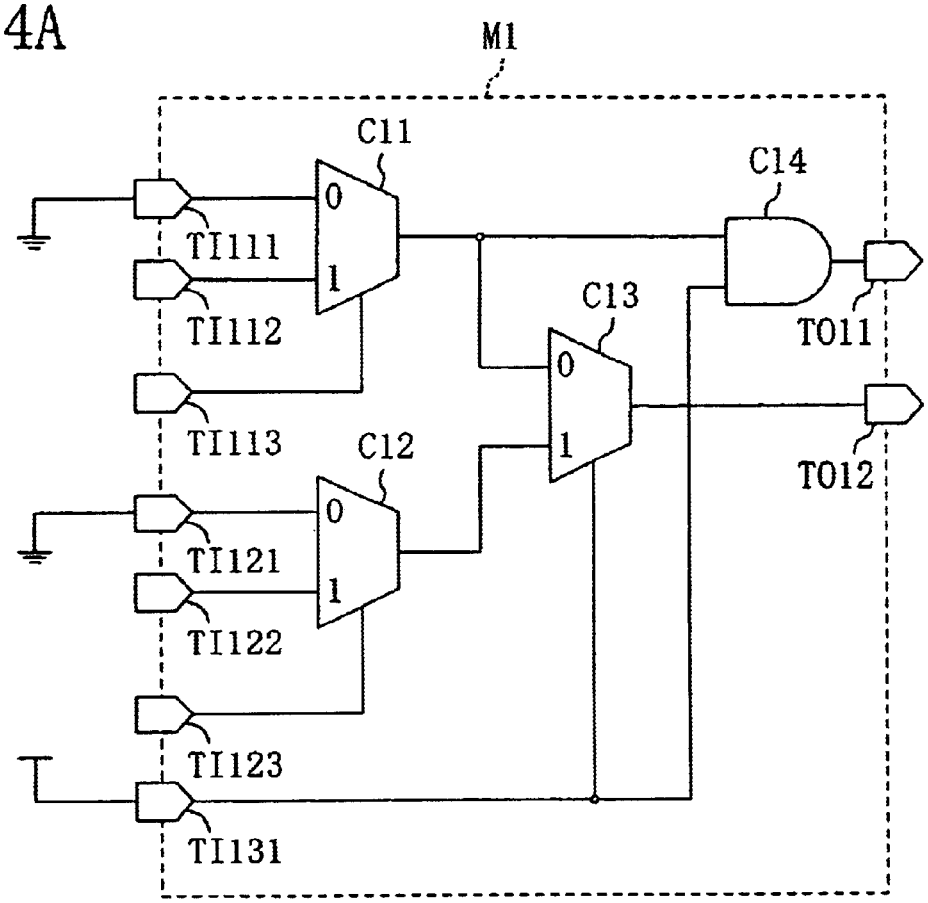
FIGS. 4A and 4B are diagrams showing the connection for implementing two independent AND logics using the logic circuit module.
Figure 4B:
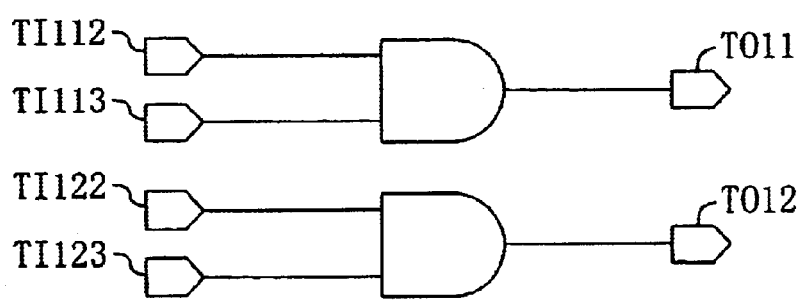

In FIGS. 4A and 4B, the same reference numerals and characters as those of FIG. 1 denote the same components. As shown in FIG. 4A, the first and fourth input terminals TI111 and TI121 of the logic circuit module M1 are grounded, and the seventh input terminal TI131 thereof is connected to the power supply. As shown in FIG. 2B, such a structure enables the following two AND logics to be implemented independently of each other: an AND logic having the second and third input terminals TI112 and TI113 as its inputs and the first output terminal TO11 as its output; and an AND logic having the fifth and sixth input terminals TI122 and TI123 as its inputs and the second output terminal TO12 as its output.

(Two independent 2-1 multiplexer logics)

Figure 5A:
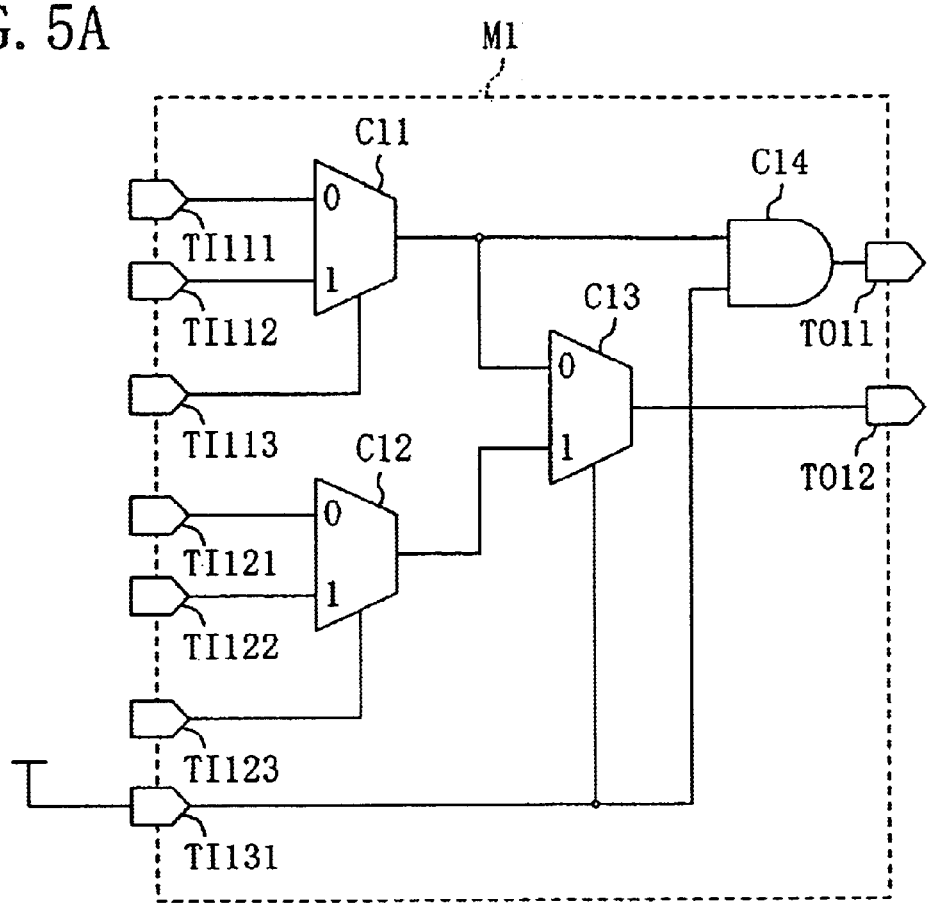
FIGS. 5A and 5B are diagrams showing the connection for implementing two independent 2-1 multiplexer logics using the logic circuit module.
Figure 5B:
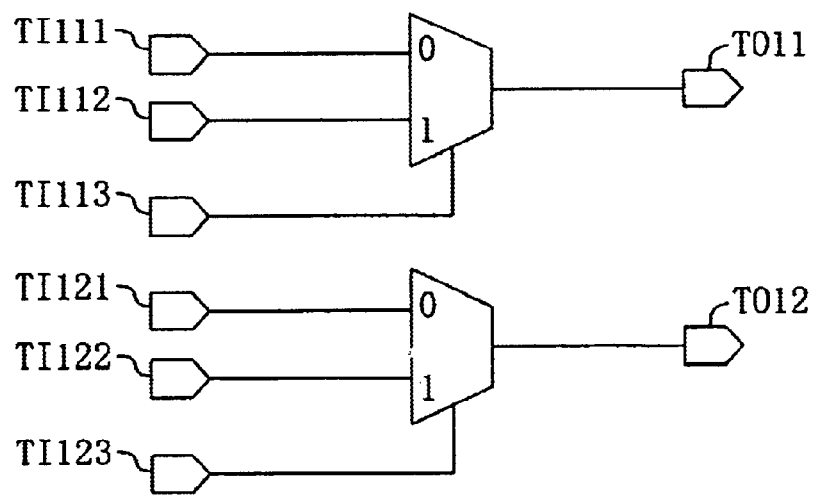

In FIGS. 5A and 5B, the same reference numerals and characters as those of FIG. 1 denote the same components. As shown in FIG. 5A, the seventh input terminal TI131 of the logic circuit module M1 is connected to the power supply. As shown in FIG. 5B, such a structure enables the following two 2-1 multiplexer logics to be implemented independently of each other: a 2-1 multiplexer logic having the first and second input terminals TI111 and TI112 as its signal inputs, the third input terminal TI113 as its selection signal, and the first output terminal TO11 as its output; and a 2-1 multiplexer logic having the fourth and fifth input terminals TI121 and TI122 as its signal inputs, the sixth input terminal TI123 as its selection signal, and the second output terminal TO12 as its output.

Hereinafter, description will be given in connection with FIGS. 6A and 6B that the logic circuit module M1 of FIG. 1 can be used as a half adder.

(Half adder)

Figure 6A:
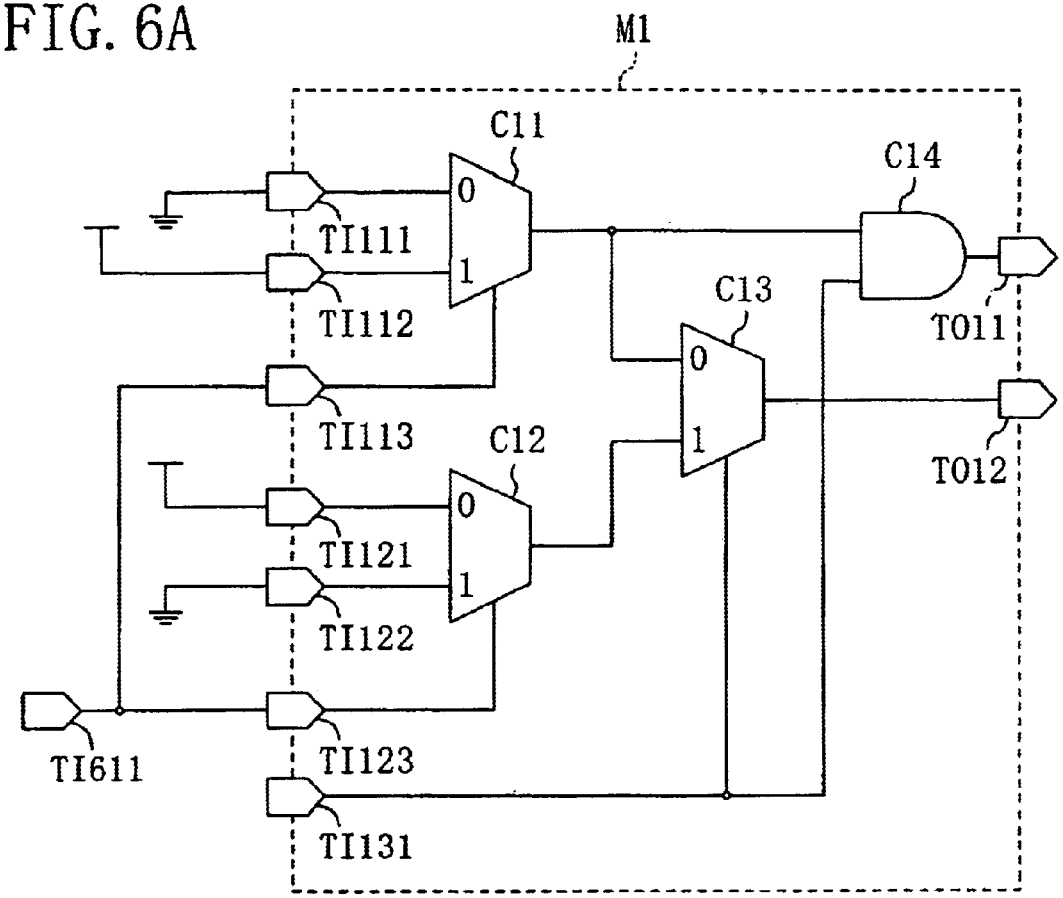
FIGS. 6A and 6B are diagrams showing the connection for implementing a half adder using the logic circuit module.
Figure 6B:
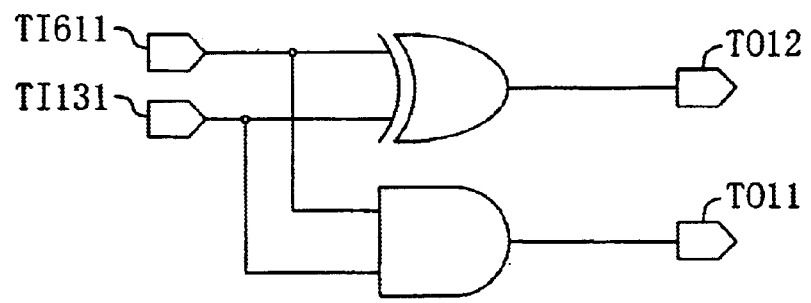

In FIGS. 6A and 6B, the same reference numerals and characters as those of FIG. 1 denote the same components. As shown in FIG. 6A, in the logic circuit module M1, the first and fifth input terminals TI111 and TI122 are grounded, the second and fourth input terminals TI112 and TI121 are connected to the power supply, and the third and sixth input terminals TI113 and TI123 are connected together into an external input terminal TI611. As shown in FIG. 6B, such a structure enables a half adder to be implemented. This half adder has the seventh input terminal TI131 as its addition input, the second output terminal TO12 as its addition result output, and the first output terminal TO11 as its carry output.

(2-bit full adder)

Hereinafter, an example of a 2-bit full adder will now be described in connection with FIG. 7. This 2-bit full adder uses four circuits each having a function of the half adder shown in FIGS. 6A and 6B, and a single circuit having two independent OR functions shown in FIGS. 3A and 3B.

Figure 7:
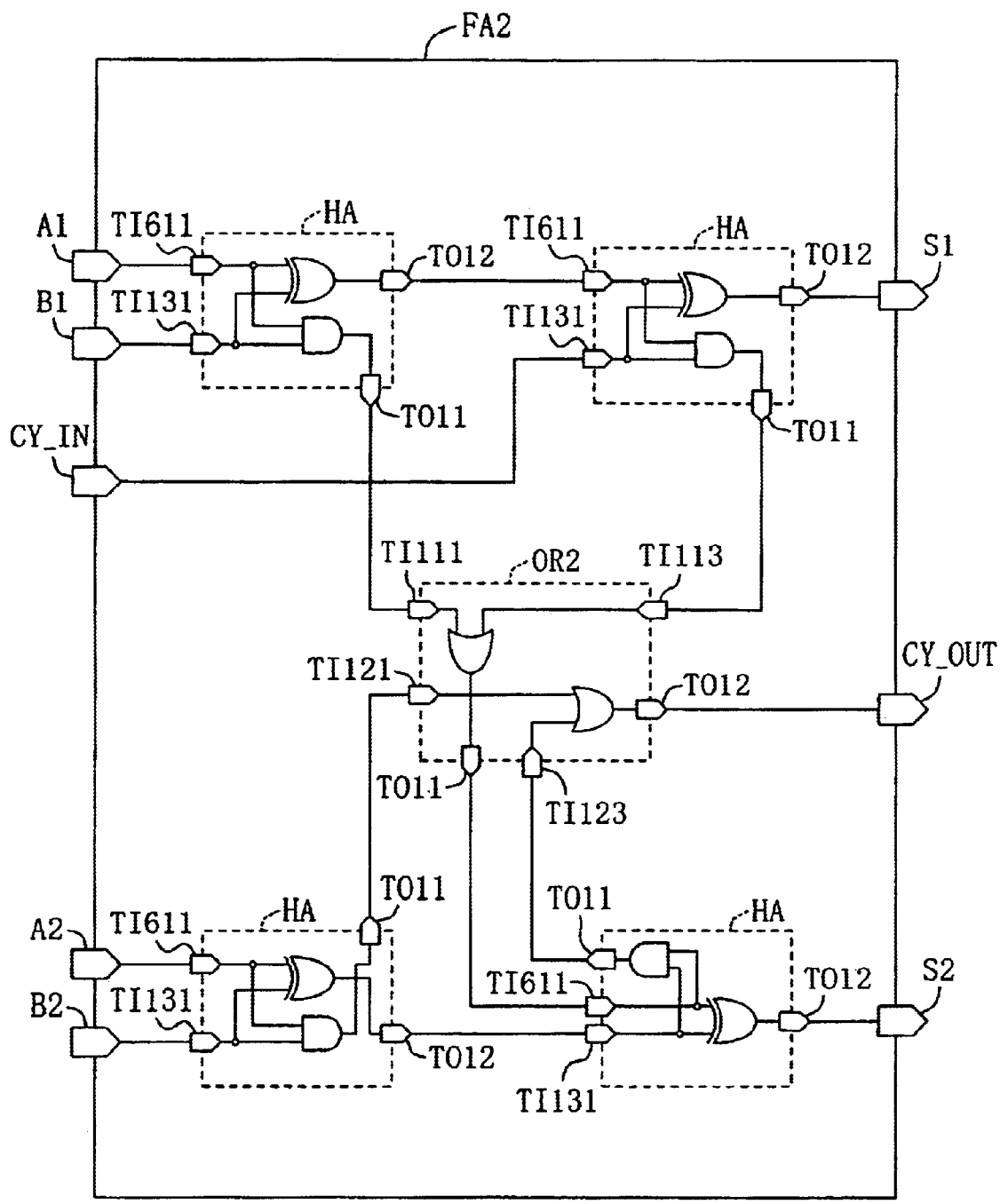
FIG. 7 is a diagram showing the connection for implementing a 2-bit full adder using the logic circuit module.

In FIG. 7, the same reference numerals and characters as those of FIGS. 1, 3A, 3B, 6A and 6B denote the same components. In FIG. 7, FA2 denotes a 2-bit full adder. The 2-bit full adder FA2 adds 2-bit addition data 1 (A1, A2 from the lower bit), 2-bit addition data 2 (B1, B2 from the lower bit) and a carry CY_IN from the lower order to the 2-bit adder, and outputs the addition result (two bits) to output terminals S1 and S2 from the lower bit, as well as outputs the carry to an output terminal CY_OUT.

In FIG. 7, HA denotes a logic circuit module performing a function of the half adder as shown in FIGS. 6A and 6B, and OR2 denotes a logic circuit module performing two independent OR functions as shown in FIGS. 3A and 3B. The circuits in the half adders HA and the independent two OR functions OR2 are equivalent circuits that are shown in a simplified manner for convenience in order to facilitate understanding of the operation. The use of four logic circuit modules each operating as half adder HA and a single logic circuit module operating as two independent ORs as shown in FIG. 7 enables configuration of a 2-bit full adder.

(Resettable storage circuit)

Hereinafter, an example of a resettable storage circuit configured using the logic circuit module of FIG. 1 will be described in connection with FIGS. 8A and 8B.

Figure 8A:
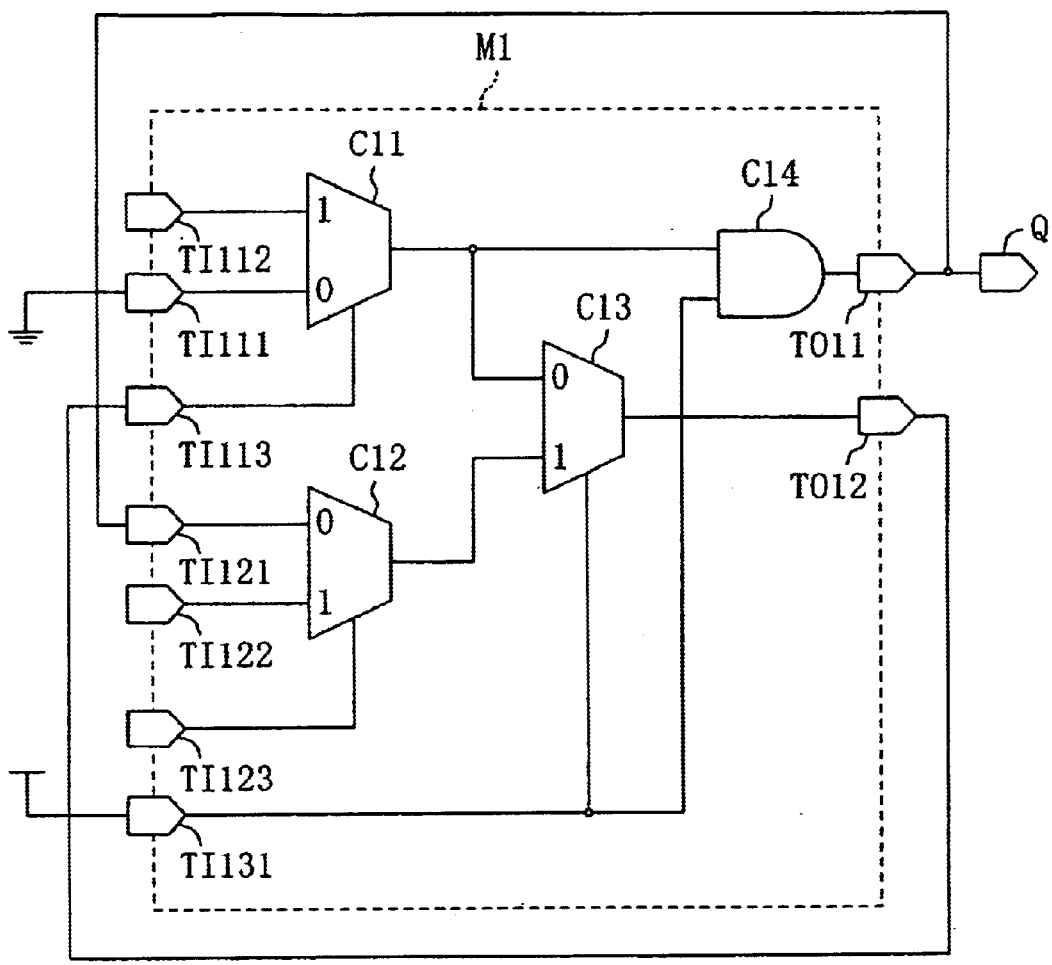
FIGS. 8A and 8B are diagrams showing the connection for implementing a resettable storage circuit using the logic circuit module.
Figure 8B:
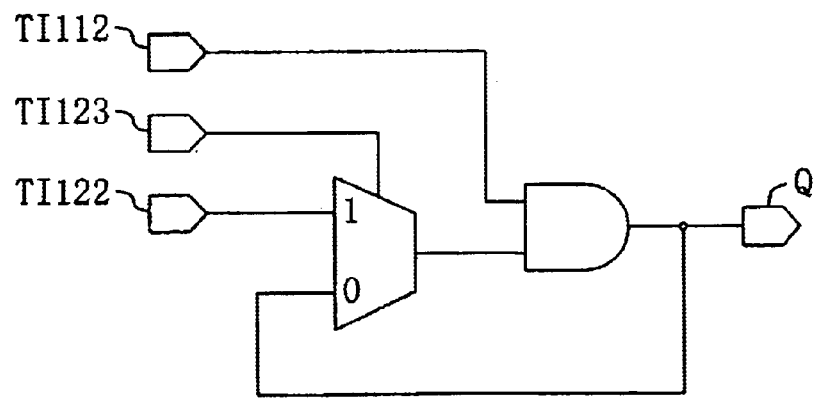

In FIGS. 8A and 8B, the same reference numerals and characters as those of FIG. 1 denote the same components. As shown in FIG. 8A, in the logic circuit module M1, the first input terminal TI111 is grounded, the seventh input terminal TI131 is connected to the power supply, the fourth input terminal TI121 and the first output terminal TO11 are connected to each other, and the third input terminal TI113 and the second output terminal TO12 are connected to each other. As shown in FIG. 8B, such a structure enables a resettable storage circuit to be configured. This resettable storage circuit has the second input terminal TI112 as its reset input, the fifth input terminal TI122 as its data input, the sixth input terminal TI123 as its data fetch/hold selection input, and an external output terminal Q connected to the first output terminal TO11 as its data output.

(Settable storage circuit)

Hereinafter, an example of a settable storage circuit configured using the logic circuit module of FIG. 1 will be described with reference to FIGS. 9A and 9B.

Figure 9A:
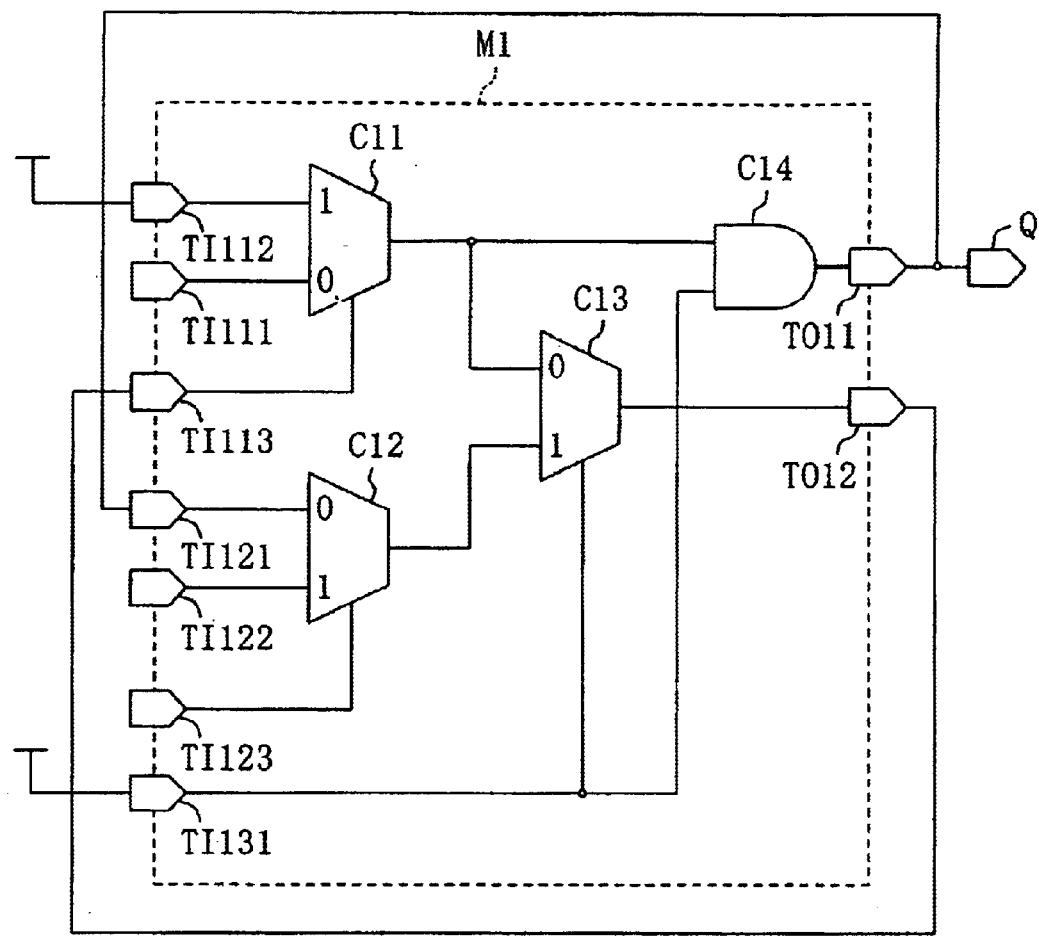
FIGS. 9A and 9B are diagrams showing the connection for implementing a settable storage circuit using the logic circuit module.
Figure 9B:
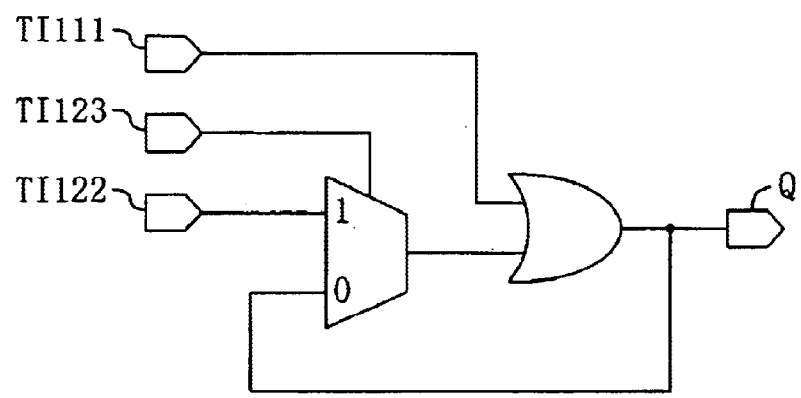

In FIGS. 9A and 9B, the same reference numerals and characters as those of FIG. 1 denote the same components. As shown in FIG. 9A, in the logic circuit module M1, the second and seventh input terminals TI112 and TI131 are connected to the power supply, the fourth input terminal TI121 and the first output terminal TO11 are connected to each other, and the third input terminal TI113 and the second output terminal TO12 are connected to each other. As shown in FIG. 9B, such a structure enables a settable storage circuit to be configured. This settable storage circuit has the first input terminal TI111 as its set input, the fifth input terminal TI122 as its data input, the sixth input terminal TI123 as its data fetch/hold selection input, and an external output terminal Q connected to the first output terminal TO11 as its data output.

(FPGA using the logic circuit module)

Hereinafter, an example of a FPGA semiconductor device using the logic circuit module M1 of FIG. 1 in the FPGA will be described in connection with FIGS. 10 and 11.

Figure 10:
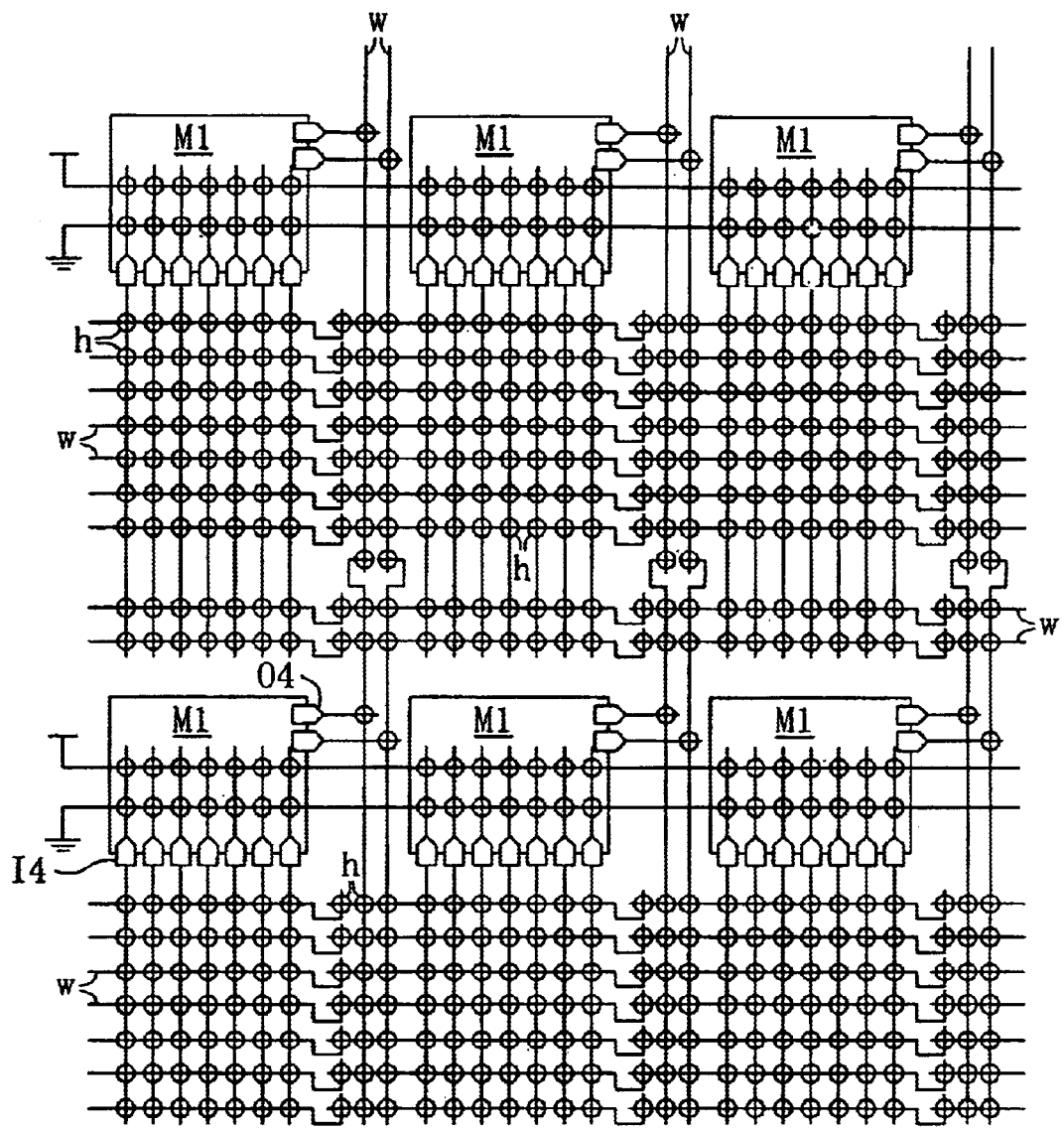
FIG. 10 is a conceptual diagram showing an example of an FPGA semiconductor device formed using the logic circuit module of the embodiment.

FIG. 10 shows the concept of the FPGA using the logic circuit module M1 of FIG. 1. In FIG. 10, M1 denotes a logic circuit module implementing the logic shown in FIG. 1, and I4 denotes input terminals of the logic circuit module M1, which correspond to the input terminals TI111, TI112, TI113, TI121, TI122, TI123 and TI131 of FIG. 1 from the left. Moreover, O4 denotes output terminals of the logic circuit module M1, which corresponds to the output terminals TO11 and TO12 from the top. The longitudinal and lateral solid lines in FIG. 10 represent wirings w within the FPGA, which are formed in adjacent wiring layers. Circles at the intersections of the longitudinal and lateral wirings w represent so-called anti-fuses (connecting means) h. These anti-fuses h are located in a wiring layer between the longitudinal and lateral wirings w located adjacent to each other. Prior to programming, the longitudinal and lateral wirings w are insulated from each other.

Figure 11:
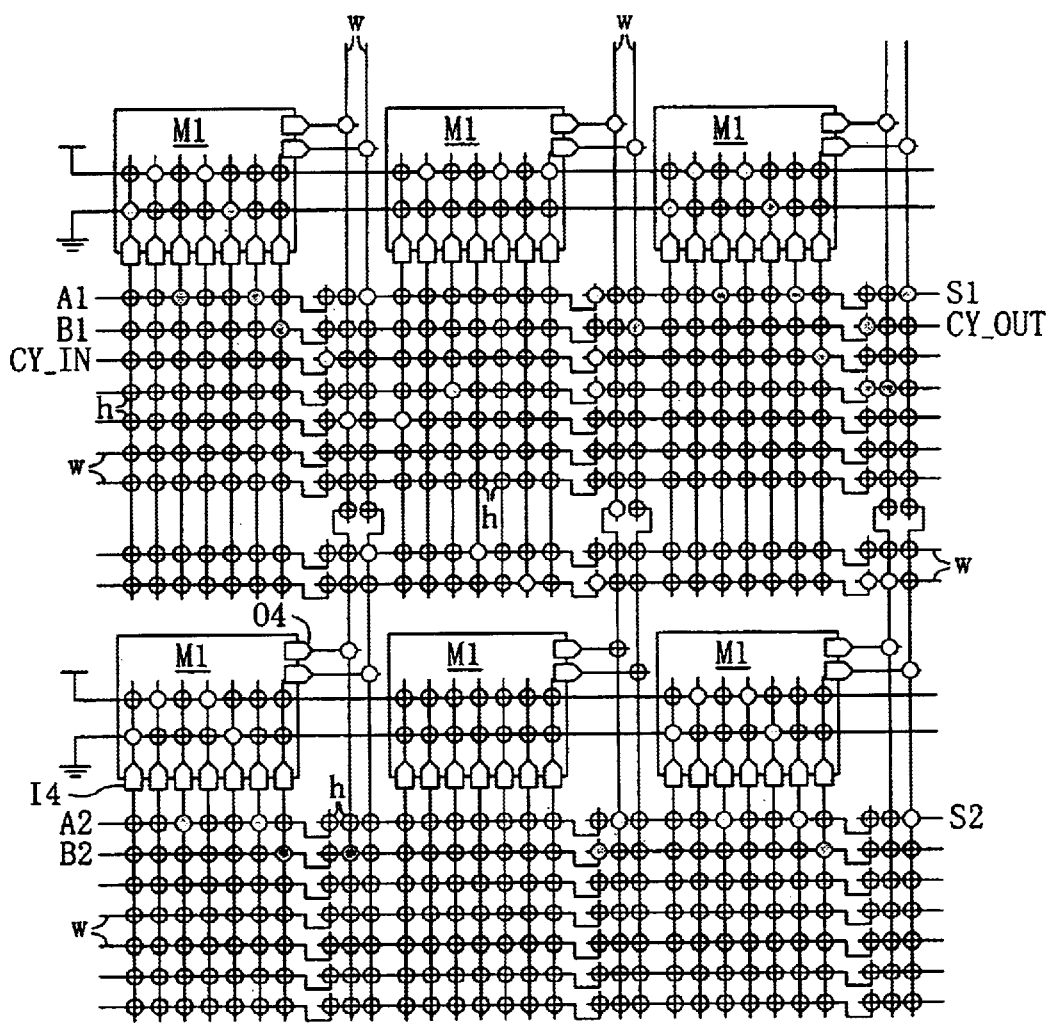
FIG. 11 is a conceptual diagram showing an example of a 2-bit full adder implemented using the FPGA semiconductor device.

An example of the programmed FPGA of FIG. 10 is shown in FIG. 11. FIG. 11 shows an example of the 2-bit full adder of FIG. 7 implemented with the FPGA of FIG. 10. In FIG. 11, the same reference numerals and characters as those of FIGS. 7 and 10 denote the same components. In FIG. 11, black circles at the intersections of the longitudinal and lateral wirings w indicate that a corresponding insulated anti-fuse is blown so as to connect the corresponding longitudinal and lateral wirings w to each other.

This example is described with respect to the anti-fuses. However, instead of using the anti-fuses, the source and drain portions of pass transistors may be respectively connected to the longitudinal and lateral wirings w, as well as the outputs of storage elements such as SRAMs (Static Random Access Memories) may be respectively connected to the gates of the pass transistors. This results in an SRAM-type FPGA that is programmable by rewriting the storage elements. Alternatively, the anti-fuses may be replaced with vias for connecting the longitudinal and lateral wirings w. In this case, a gate array can be implemented which is capable of changing the circuit operation of the semiconductor device by merely replacing masks of the vias during manufacturing.

Figures 12A, 12B:
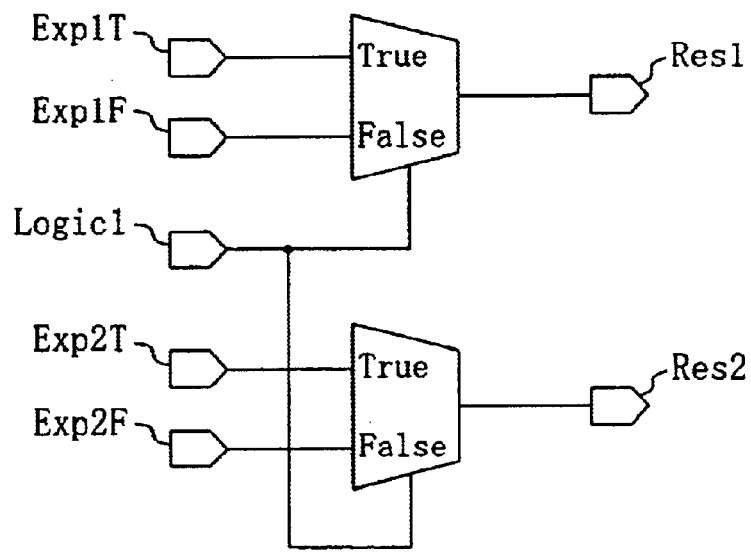
FIG. 12A is a diagram showing an example of verilog-HDL (Hardware Description Language) description of a 2-1 multiplexer.
FIG. 12B is a diagram showing an example of an equivalent circuit of the description.
Figure 16A:
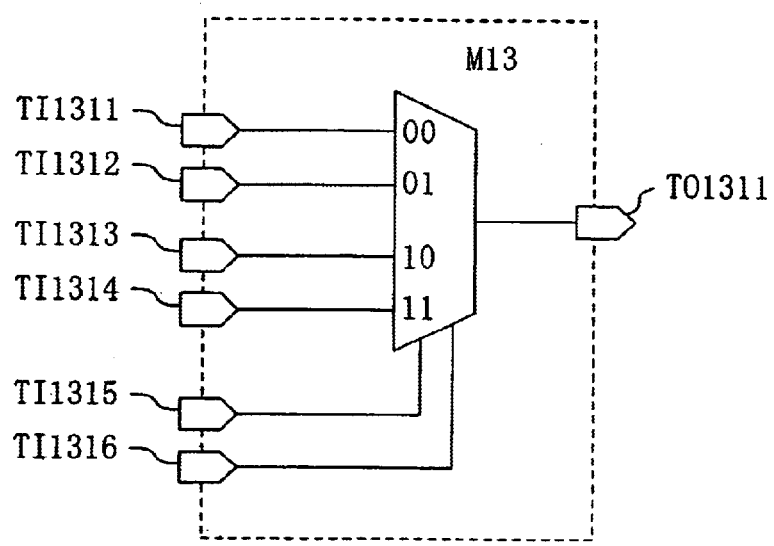
FIG. 16A is a diagram showing an example of a logic circuit module for use in a conventional FPGA and gate for short-term development.
Figure 16B:
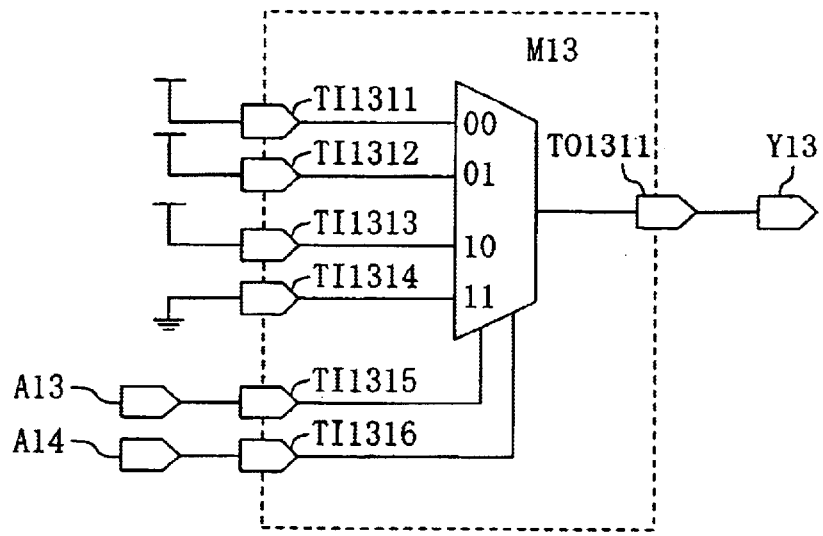
FIG. 16B is a diagram showing an example of the connection implementing a NAND circuit using the logic circuit module.

As has been described above, with the logic circuit module M1 of the present embodiment shown in FIG. 1, two independent logic circuits can be implemented per logic circuit module, allowing for improved area efficiency even in a semiconductor integrated circuit using a large number of two-input logic circuits. For example, in the case of implementing two 2-1 multiplexers, the CMOS logic circuit module of the present invention exemplified in FIGS. 2A and 2B is formed from 32 transistors. In contrast, the logic circuit module of the conventional example shown in FIG. 16 is formed from 26 transistors when implemented with the same structure as that of FIGS. 2A and 2B. Since two logic circuit modules are necessary, a total of 52 transistors are required. Accordingly, the logic circuit module M1 of the present embodiment shown in FIG. 1 allows for significant improvement in area efficiency over the conventional logic circuit module of FIG. 16. Moreover, the use of the conventional logic circuit module requires a region for wirings that connect the two logic circuit modules to each other. However, the logic circuit module M1 of the present embodiment does not require such a wiring region, resulting in a compact semiconductor integrated circuit. The 2-1 multiplexer logic is described in the verilog-HDL as shown in FIG. 12A, and an exemplary equivalent circuit thereof is commonly used as the circuit shown in FIG. 12B. Therefore, the logic circuit module M1 of the present embodiment shown in FIG. 1 is practically effective.

(Method for designing a semiconductor integrated circuit using the logic circuit module)

Hereinafter, an example of a semiconductor integrated circuit will be described in connection with FIGS. 13A to 13C. In this example, a cell base IC having the logic circuit module M1 of FIG. 1 incorporated therein is manufactured, and correction is made with the logic circuit module when the necessity for circuit correction arises.

Figure 13A:
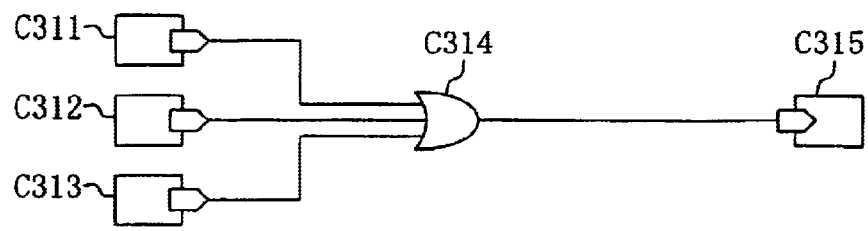
FIG. 13A is a diagram showing an uncorrected circuit manufactured with the logic circuit module incorporated into a cell base IC.
Figure 13B:
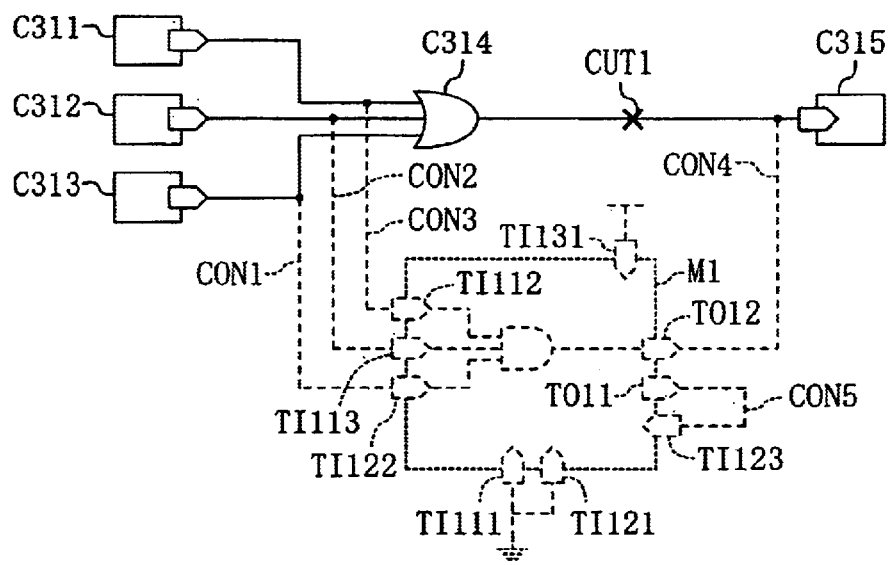
FIG. 13B is a diagram illustrating a manner of correcting the uncorrected circuit using the logic circuit module.
Figure 13C:
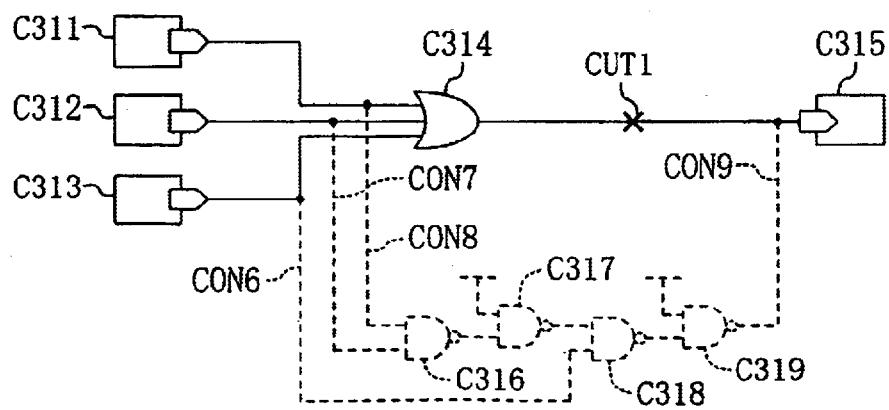
FIG. 13C is a diagram illustrating a manner of correcting the circuit using NAND macro cells incorporated in advance into the cell base IC according to a conventional example.

In FIGS. 13A to 13C, the same reference numerals and characters as those of FIG. 1 denote the same components. FIG. 13A shows an uncorrected, original circuit. In this circuit, the OR logic circuit C314 obtains an OR logic of respective outputs of the logic circuits C311, C312 and C313, and applies the OR logic output to the input of another logic circuit C315. It is now assumed that this circuit should be corrected so as to apply an AND logic of the logic circuits C311, C312 and C313 to the input of the logic circuit C315 instead of the OR logic. FIG. 13B shows an example of the circuit corrected using the logic circuit module M1 of FIG. 1 incorporated in advance. In FIG. 13B, the dashed lines indicate a corrected portion. In FIG. 13B, M1 denotes a logic circuit module that has been incorporated in advance, and a circuit within the module M1 is an equivalent circuit shown in a simplified manner for convenience. As shown in connection with FIGS. 4A and 4B, the logic circuit module M1 has its seventh input terminal TI131 connected to the power supply and its first and fourth input terminals TI111 and TI121 grounded, thereby internally implementing two independent AND logics. Connecting the output of one of the two independent AND logics (the first output terminal TO11 in the figure) to one input of the other AND logic (the input terminal TI123 in the example of the figure) through a wiring CON5 results in a three-input AND logic circuit having the three input terminals TI112, TI113 and TI122 as its inputs and the output terminal TO12 as its output, as shown in the logic circuit module M1 for convenience. The correction can be made as follows: the inputs of the three-input AND logic circuit are respectively connected to wirings CON1, CON2 and CON3 connecting to the respective inputs of the logic circuit C314, and a wiring connecting to the output of the logic circuit C314 is disconnected (shown by CUT1 in the figure) so that the output of the three-input AND logic circuit is connected to the input of the logic circuit C315 through a wiring CON4.

(First modification of the logic circuit module)

Figure 14:
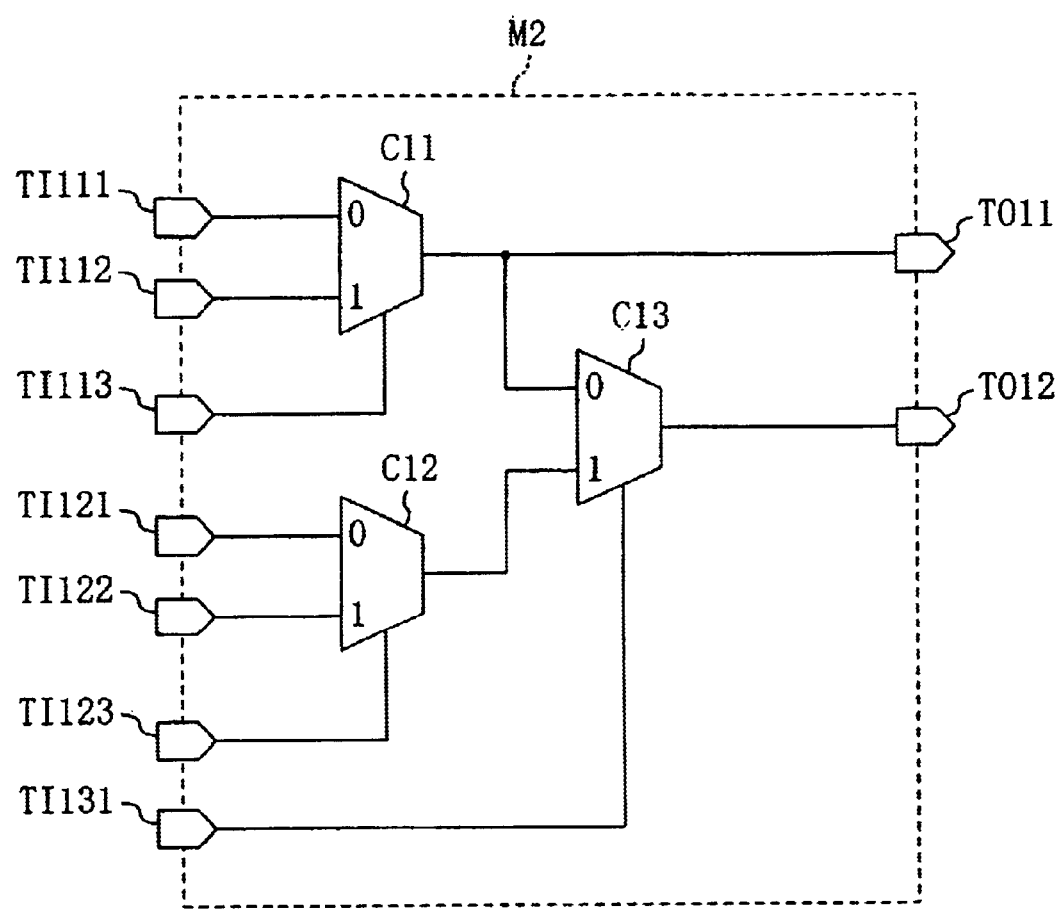
FIG. 14 is a diagram showing a first modification of the logic circuit module.

FIG. 14 shows a first modification of the logic circuit module. The structure of the logic circuit module M2 of FIG. 14 is generally the same as that of the logic circuit module M1 of FIG. 1 except that the two-input AND circuit C14 is eliminated so that the signal selected by the 2-1 multiplexer C11 is directly output to the output terminal TO11. The logic circuit module M2 of this modification enables implementation of the two independent logic circuits of FIGS. 3B, 4B, 5B, 8B and 9B.

(Second modification of logic circuit module)

Figure 15:
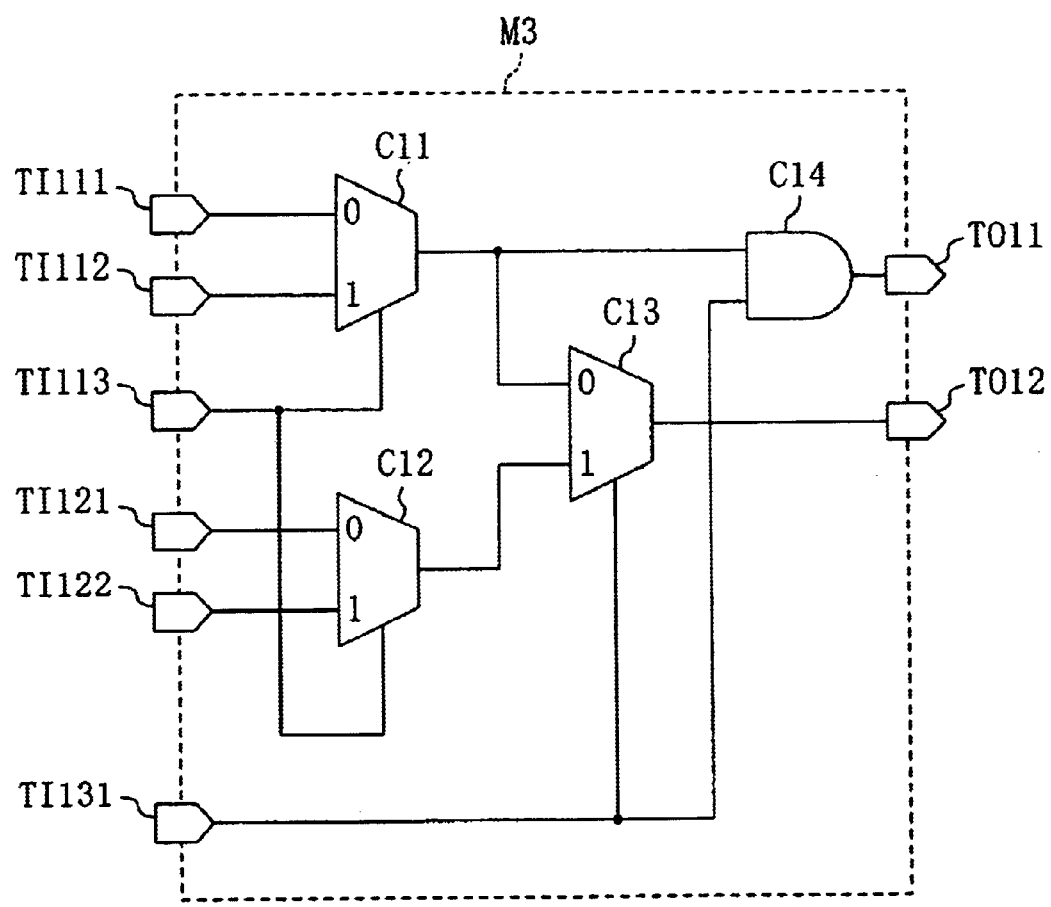
FIG. 15 is a diagram showing a second modification of the logic circuit module.

FIG. 15 shows a second modification of the logic circuit module. In the logic circuit module M3 of FIG. 15, the third input terminal TI113 of the logic circuit module M2 of FIG. 14 serves also as the sixth input terminal TI123. The logic circuit module M2 of this modification enables implementation of the two independent logic circuits of FIGS. 3B, 4B and 5B.

Although the two modifications of the logic circuit module have been described, the present invention is not limited to them. For example, the logic elements included in the logic circuit module of the present invention are not limited to the three 2-1 multiplexers. The logic circuit module of the present invention may include four or more multiplexers. Alternatively, the logic circuit module of the present invention may include logic elements other than the 2-1 multiplexers. Moreover, the logic circuit module of the present invention may include any number of output terminals instead of the two output terminals.

What is claimed is:

1. A logic circuit module, characterized in that
it comprises first to seventh input terminals, first and second output terminals, and first to third 2-1 mutiplexers,
the first 2-1 mutiplexer has its two signal terminals respectively connected to the first and second input terminals, and its selection terminal connected to the third input terminal,
the second 2-1 mutiplexer has its two signal terminals respectively connected to the fourth and fifth input terminals, and its selection terminal connected to the sixth input terminal,
the third 2-1 mutiplexer has its two signal terminals respectively connected to signals selected by the first and second 2-1 mutiplexers, and its selection terminal connected to the seventh input terminal, and
the first output terminal receives a signal selected by the first 2-1 mutiplexer, and the second output terminal receives a signal selected by the third 2-1 mutiplexer,
wherein the first, third, fourth and sixth input terminals are respectively connected to external signal lines, and the second, fifth and seventh input terminals are connected to a power supply, thereby implementing two independent OR logics.

2. A method for designing a semiconductor integrated circuit, characterized in that
the semiconductor integrated circuit includes a plurality of logic circuit modules of claim 1, and
the semiconductor integrated circuit conducting a prescribed operation is designed by connecting the input terminals of the logic circuit modules to a power supply or ground, or connecting an input terminal of a logic circuit module to an output terminal of another logic circuit module.

3. The method according to claim 2, characterized by designing the semiconductor integrated circuit conducting the prescribed operation by
forming in advance longitudinal and lateral wirings for connecting the input terminals of the logic circuit modules to the power supply or ground, or connecting the input terminals of the logic circuit modules to the output terminals thereof, and a plurality of connecting means for connecting the longitudinal and lateral wirings to each other, and
then programming so as to connect prescribed longitudinal and lateral wirings to each other through a prescribed one of the plurality of connecting means.

4. A method for designing a semiconductor integrated circuit, characterized by
manufacturing the semiconductor integrated circuit with the logic circuit module of claim 1 incorporated therein, and
when necessity for correction of the manufactured semiconductor integrated circuit arises, correcting the semiconductor integrated circuit by connecting a wiring to the incorporated logic circuit module.

5. A logic circuit module, characterized in that
it comprises first to seventh input terminals, first and second output terminals, and first to third 2-1 mutiplexers,
the first 2-1 mutiplexer has its two signal terminals respectively connected to the first and second input terminals, and its selection terminal connected to the third input terminal,
the second 2-1 mutiplexer has its two signal terminals respectively connected to the fourth and fifth input terminals, and its selection terminal connected to the sixth input terminal,
the third 2-1 mutiplexer has its two signal terminals respectively connected to signals selected by the first and second 2-1 mutiplexers, and its selection terminal connected to the seventh input terminal, and
the first output terminal receives a signal selected by the first 2-1 mutiplexer, and the second output terminal receives a signal selected by the third 2-1 mutiplexer,
wherein the first and fourth input terminals are connected to a ground, the seventh input terminal is connected to a power supply, and the second, third, fifth and sixth input terminals are respectively connected to external signal lines, thereby implementing two independent AND logics.

6. A method for designing a semiconductor integrated circuit, characterized in that
the semiconductor integrated circuit includes a plurality of logic circuit modules of claim 5, and
the semiconductor integrated circuit conducting a prescribed operation is designed by connecting the input terminals of the logic circuit modules to a power supply or ground, or connecting an input terminal of a logic circuit module to an output terminal of another logic circuit module.

7. The method according to claim 6, characterized by designing the semiconductor integrated circuit conducting the prescribed operation by
forming in advance longitudinal and lateral wirings for connecting the input terminals of the logic circuit modules to the power supply or ground, or connecting the input terminals of the logic circuit modules to the output terminals thereof, and a plurality of connecting means for connecting the longitudinal and lateral wirings to each other, and then programming so as to connect prescribed longitudinal and lateral wirings to each other through a prescribed one of the plurality of connecting means.

8. A method for designing a semiconductor integrated circuit, characterized by manufacturing the semiconductor integrated circuit with the logic circuit module of claim 5 incorporated therein, and when necessity for correction of the manufactured semiconductor integrated circuit arises, correcting the semiconductor integrated circuit by connecting a wiring to the incorporated logic circuit module.

9. The logic circuit module according to claim 5, characterized in that it further comprises a two-input AND circuit, the AND circuit receives the signal selected by the first 2-1 multiplexer, and the seventh input terminal is connected to the AND circuit, and the first output terminal receives an output signal of the AND circuit.

10. A logic circuit module, characterized in that it comprises first to seventh input terminals, first and second output terminals, and first to third 2-1 mutiplexers, the first 2-1 mutiplexer has its two signal terminals respectively connected to the first and second input terminals, and its selection terminal connected to the third input terminal, the second 2-1 mutiplexer has its two signal terminals respectively connected to the fourth and fifth input terminals, and its selection terminal connected to the sixth input terminal, the third 2-1 mutiplexer has its two signal terminals respectively connected to signals selected by the first and second 2-1 mutiplexers, and its selection terminal connected to the seventh input terminal, and the first output terminal receives a signal selected by the first 2-1 mutiplexer, and the second output terminal receives a signal selected by the third 2-1 mutiplexer, wherein the first to sixth input terminals are respectively connected to external signal lines, and the seventh input terminal is connected to a power supply, thereby implementing two independent 2-1 mutiplexer logics.

11. A method for designing a semiconductor integrated circuit, characterized in that the semiconductor integrated circuit includes a plurality of logic circuit modules of claim 10, and the semiconductor integrated circuit conducting a prescribed operation is designed by connecting the input terminals of the logic circuit modules to a power supply or ground, or connecting an input terminal of a logic circuit module to an output terminal of another logic circuit module.

12. The method according to claim 11, characterized by designing the semiconductor integrated circuit conducting the prescribed operation by forming in advance longitudinal and lateral wirings for connecting the input terminals of the logic circuit modules to the power supply or ground, or connecting the input terminals of the logic circuit modules to the output terminals thereof, and a plurality of connecting means for connecting the longitudinal and lateral wirings to each other, and then programming so as to connect prescribed longitudinal and lateral wirings to each other through a prescribed one of the plurality of connecting means.

13. A method for designing a semiconductor integrated circuit, characterized by manufacturing the semiconductor integrated circuit with the logic circuit module of claim 10 incorporated therein, and when necessity for correction of the manufactured semiconductor integrated circuit arises, correcting the semiconductor integrated circuit by connecting a wiring to the incorporated logic circuit module.

14. The logic circuit module according to claim 10, characterized in that it further comprises a two-input AND circuit, the AND circuit receives the signal selected by the first 2-1 multiplexer, and the seventh input terminal is connected to the AND circuit, and the first output terminal receives an output signal of the AND circuit.

15. A logic circuit module, characterized in that it comprises first to seventh input terminals, first and second output terminals, and first to third 2-1 mutiplexers, the first 2-1 mutiplexer has its two signal terminals respectively connected to the first and second input terminals, and its selection terminal connected to the third input terminal, the second 2-1 mutiplexer has its two signal terminals respectively connected to the fourth and fifth input terminals, and its selection terminal connected to the sixth input terminal, the third 2-1 mutiplexer has its two signal terminals respectively connected to signals selected by the first and second 2-1 mutiplexers, and its selection terminal connected to the seventh input terminal, and the first output terminal receives a signal selected by the first 2-1 mutiplexer, and the second output terminal receives a signal selected by the third 2-1 mutiplexer, wherein the logic circuit module further comprises a two-input AND circuit, the AND circuit receives the signal selected by the first 2-1 mutiplexer, and the seventh input terminal is connected to the AND circuit, and the first output terminal receives an output signal of the AND circuit, wherein the first and fifth input terminals are connected to a ground, the second and fourth input terminals are connected to a power supply, the third and sixth input terminals are connected to a common external signal line, and the seventh input terminal is connected to another external signal line so as to form an EX-OR logic and an AND logic each receiving as inputs two signals of the common external signal line and the another external signal line, thereby implementing a half adder.

16. A semiconductor integrated circuit, characterized in that it comprises four logic circuit modules each implementing the half adder of claim 15, and a single logic circuit module implementing the two OR logics of claim 6, and a lower-bit full adder is formed from two of the four logic circuit modules each implementing the half adder and one of the two OR logics implemented by the logic circuit module, and an upper-bit full adder is formed from the other two logic circuit modules each implementing the half adder and the other OR logic implemented by the logic circuit module, thereby implementing a 2-bit full adder.

17. A method for designing a semiconductor integrated circuit, characterized in that the semiconductor integrated circuit includes a plurality of logic circuit modules of claim 15, and the semiconductor integrated circuit conducting a prescribed operation is designed by connecting the input terminals of the logic circuit modules to a power supply or ground, or connecting an input terminal of a logic circuit module to an output terminal of another logic circuit module.

18. The method according to claim 17, characterized by designing the semiconductor integrated circuit conducting the prescribed operation by forming in advance longitudinal and lateral wirings for connecting the input terminals of the logic circuit modules to the power supply or ground, or connecting the input terminals of the logic circuit modules to the output terminals thereof, and a plurality of connecting means for connecting the longitudinal and lateral wirings to each other, and then programming so as to connect prescribed longitudinal and lateral wirings to each other through a prescribed one of the plurality of connecting means.

19. A method for designing a semiconductor integrated circuit, characterized by manufacturing the semiconductor integrated circuit with the logic circuit module of claim 16, incorporated therein, and when necessity for correction of the manufactured semiconductor integrated circuit arises, correcting the semiconductor integrated circuit by connecting a wiring to the incorporated logic circuit module.

20. A logic circuit module, characterized in that it comprises first to seventh input terminals, first and second output terminals, and first to third 2-1 mutiplexers, the first 2-1 mutiplexer has its two signal terminals respectively connected to the first and second input terminals, and its selection terminal connected to the third input terminal, the second 2-1 mutiplexer has its two signal terminals respectively connected to the fourth and fifth input terminals, and its selection terminal connected to the sixth input terminal, the third 2-1 mutiplexer has its two signal terminals respectively connected to signals selected by the first and second 2-1 mutiplexers, and its selection terminal connected to the seventh input terminal, and the first output terminal receives a signal selected by the first 2-1 mutiplexer, and the second output terminal receives a signal selected by the third 2-1 mutiplexer, wherein the second, fifth and sixth input terminals are respectively connected to external signal lines, the first input terminal is connected to a ground, the seventh input terminal is connected to a power supply, the third input terminal is connected to the second output terminal, and the fourth input terminal is connected to the first output terminal so as to form an AND logic and a 2-1 mutiplexer that are independent of each other, and an output of the AND logic is connected to one of two signal terminals of the 2-1 multiplexer, thereby implementing a storage circuit having a reset function.

21. A method for designing a semiconductor integrated circuit, characterized in that the semiconductor integrated circuit includes a plurality of logic circuit modules of claim 20, and the semiconductor integrated circuit conducting a prescribed operation is designed by connecting the input terminals of the logic circuit modules to a power supply or ground, or connecting an input terminal of a logic circuit module to an output terminal of another logic circuit module.

22. The method according to claim 21, characterized by designing the semiconductor integrated circuit conducting the prescribed operation by forming in advance longitudinal and lateral wirings for connecting the input terminals of the logic circuit modules to the power supply or ground, or connecting the input terminals of the logic circuit modules to the output terminals thereof, and a plurality of connecting means for connecting the longitudinal and lateral wirings to each other, and then programming so as to connect prescribed longitudinal and lateral wirings to each other through a prescribed one of the plurality of connecting means.

23. A method for designing a semiconductor integrated circuit, characterized by manufacturing the semiconductor integrated circuit with the logic circuit module of claim 20 incorporated therein, and when necessity for correction of the manufactured semiconductor integrated circuit arises, correcting the semiconductor integrated circuit by connecting a wiring to the incorporated logic circuit module.

24. A The logic circuit module according to claim 20, characterized in that it further comprises a two-input AND circuit, the AND circuit receives the signal selected by the first 2-1 mutiplexer, and the seventh input terminal is connected to the AND circuit, and the first output terminal receives an output signal of the AND circuit.

25. A logic circuit module, characterized in that it comprises first to seventh input terminals, first and second output terminals, and first to third 2-1 mutiplexers, the first 2-1 mutiplexer has its two signal terminals respectively connected to the first and second input terminals, and its selection terminal connected to the third input terminal, the second 2-1 mutiplexer has its two signal terminals respectively connected to the fourth and fifth input terminals, and its selection terminal connected to the sixth input terminal, the third 2-1 mutiplexer has its two signal terminals respectively connected to signals selected by the first and second 2-1 mutiplexers, and its selection terminal connected to the seventh input terminal, and the first output terminal receives a signal selected by the first 2-1 mutiplexer, and the second output terminal receives a signal selected by the third 2-1 mutiplexer, wherein the second and seventh input terminals are connected to a power supply, the first, fifth and sixth input terminals are respectively connected to external signal lines, the third input terminal is connected to the second output terminal, and the fourth input terminal is connected to the first output terminal so as to form an OR logic and a 2-1 mutiplexer that are independent of each other, and an output of the OR logic is connected to a signal terminal of the 2-1 mutiplexer, thereby implementing a storage circuit having a set function.

26. A method for designing a semiconductor integrated circuit, characterized in that
the semiconductor integrated circuit includes a plurality of logic circuit modules of claim 25, and
the semiconductor integrated circuit conducting a prescribed operation is designed by connecting the input terminals of the logic circuit modules to a power supply or ground, or connecting an input terminal of a logic circuit module to an output terminal of another logic circuit module.

27. The method according to claim 26, characterized by designing the semiconductor integrated circuit conducting the prescribed operation by
forming in advance longitudinal and lateral wirings for connecting the input terminals of the logic circuit modules to the power supply or ground, or connecting the input terminals of the logic circuit modules to the output terminals thereof, and a plurality of connecting means for connecting the longitudinal and lateral wirings to each other, and
then programming so as to connect prescribed longitudinal and lateral wirings to each other through a prescribed one of the plurality of connecting means.

28. A method for designing a semiconductor integrated circuit, characterized by
manufacturing the semiconductor integrated circuit with the logic circuit module of claim 26 incorporated therein, and
when necessity for correction of the manufactured semiconductor integrated circuit arises, correcting the semiconductor integrated circuit by connecting a wiring to the incorporated logic circuit module.

29. The logic circuit module according to claim 25, characterized in that it further comprises a two-input AND circuit, the AND circuit receives the signal selected by the first 2-1 mutiplexer, and the seventh input terminal is connected to the AND circuit, and the first output terminal receives an output signal of the AND circuit.

* * * * *